United States Patent [19]

Matsumura

[11] Patent Number: 4,676,840
[45] Date of Patent: Jun. 30, 1987

[54] METHOD OF CAPLESS ANNEALING FOR GROUP III-V COMPOUND SEMICONDUCTOR SUBSTRATE

[75] Inventor: Takao Matsumura, Tokyo, Japan

[73] Assignee: NEC Corporation, Tokyo, Japan

[21] Appl. No.: 772,081

[22] Filed: Sep. 3, 1985

[30] Foreign Application Priority Data

Sep. 6, 1984 [JP] Japan ............................ 59-186810

[51] Int. Cl.⁴ ............... H01L 21/263; H01L 29/48
[52] U.S. Cl. ........................... 148/1.5; 29/576 B; 29/576 T; 148/175; 148/187; 148/DIG. 84; 357/61
[58] Field of Search .............. 148/1.5, 175, 187; 29/576 B, 576 T; 357/61

[56] References Cited

U.S. PATENT DOCUMENTS

| | | | |
|---|---|---|---|
| 4,174,982 | 11/1979 | Immorlica, Jr. | 148/DIG. 84 |
| 4,265,661 | 5/1981 | Ware | 420/555 |
| 4,312,681 | 1/1982 | Rupprecht et al. | 148/1.5 |
| 4,357,180 | 11/1982 | Molnar | 148/1.5 |
| 4,473,939 | 10/1984 | Feng et al. | 29/571 |
| 4,489,480 | 12/1984 | Martin et al. | 29/576 B |
| 4,494,995 | 1/1985 | Tabatabaie-Acavi et al. | 148/1.5 |
| 4,544,417 | 10/1985 | Clarke et al. | 148/1.5 |

OTHER PUBLICATIONS

Sato et al., in Energy Beam-Solid ... Processing ed. Fan et al., North-Holland, N.Y. 1983, p. 645.
Kuzuhara et al., Ibid, p. 651
König et al., Jour. Electronics Materials, 14 (1985) 311.
Kasahara et al., Jour. Appl. Phys. 50 (1979) 541.
Woodall et al., Appl. Phys. Letts. 38 (1981) 639.
Mullin et al., Jour. Crystal Growth, 13-14 (1972) 629.

Primary Examiner—Upendra Roy
Attorney, Agent, or Firm—Sughrue, Mion, Zinn Macpeak & Seas

[57] ABSTRACT

A method of capless annealing for an ion implanted substrate of a group III-V compound semiconductor, wherein said ion implanted substrate is placed in an inert ambient with a temperature ranging between 500 to 1000 degrees centigrade and a pressure ranging from 30 to 90 atmospheres, thereby increasing the deep energy level EL 2 concentration in the surface portion of a semiconductor substrate. The resistivity of the compound semiconductor substrate is increased in accordance with the deep energy level EL 2 concentration. This method is conducive to maintenance of the isolation between adjacent semiconductor elements fabricated on the group III-V compound semiconductor substrate.

9 Claims, 2 Drawing Figures

METHOD OF CAPLESS ANNEALING FOR GROUP III-V COMPOUND SEMICONDUCTOR SUBSTRATE

FIELD OF THE INVENTION

This invention relates to an annealing method for an ion implanted substrate of group III-V compound semiconductor, and more particularly to a capless annealing method for activation of the implanted impurity atoms without causing damage to the isolation between adjacent semiconductor elements fabricated on the compound semiconductor substrate.

BACKGROUND OF THE INVENTION

III-V compound semiconductors, especially of gallium arsenide, find a wide variety of applications for industrial purposes on the basis of their high electron mobility, direct transion behaviour, transfered-electron efect and so on. Many kinds of electric devices such as high electron mobility transistors, light emitting diodes and Gunn diodes have been realized on various gallium arsenide substrates.

During the fabrication of the electric devices on the gallium arsenide substrates, ionized impurity atoms, typically silicon atoms, are implanted into the substrate with enough energy to penetrate beyond the surface portion in order to impart a conductivity type in selected regions. After the ion implantation, the substrate is annealed for activation of the introduced inpurity atoms in the substrate. The above steps are combined with other well-known techniques so as to complete a manufacturing process through which electric elements are fabricated on the semi-insulating substrate.

When the ion implanted substrate is annealed, the arsenic atoms tend to volatilize or out-diffuse from the substrate by the agency of heat applied to the substrate. This volatilization causes the deep energy level EL2 concentration in the surface region of the substrate to reduce with a resultant of reduction in resistivity.

Namely, the deep energy level EL2 is considered to take place due to antisite defects, in which arsenic atoms occupy some gallium sites. If the substrate is heated to a certain temperature, some of the antisite arsenic atoms occuping gallium sites are out-diffused. Therefore, the antisite defects are healed and, then, the EL2 concentration is lowered. The high resistivity results from compensation of acceptors by the EL2 deep donors so that the resistance value of the surface region is reduced under the reduction of the deep energy level El 2 concentration. This reduction in resistivity is not desirable for an isolation region electrically separating the adjacent electric elements fabricated on the substrate because of the leakage currents across the isolation region.

Attempts have been made to protect the isolation region against the volatilization arsenic atoms. One of the attempt is to apply a protection layer over the substrate prior to the heat treatment. The protection layer prevents the volatilization of the arsenic atoms to some degree, however, it can not perfectly prohibit such volatilization. Moreover, the protection layer behaves as an impurity source so that the electric elements fabricated on the substrate are subjected to influence of impurities from the impurity source, thereby giving rise to deterioration in the electric characteristics of the elements. Another attempt to prevent volatilization of the arsenic atoms is such that the polished surfaces of a pair of substrates are held in face-to-face contact with each other and, then, placed in a furnace for heat treatment. However, the face-to-face contact merely reduces the volatilization to a slight degree. Another method proposed to eliminate the volatilization of the arsenic atoms involves heat treatment carried out in an ambient formed with a group V element. However, in this conventional method the ambient is prepared by the pyrolysis of arsine, which is instantly lethal if a concentration of 250 ppm is inhaled, and exposure at lower levels poses a health hazard depending upon the lenght of exposure. Therefore this method is not desirable for operators in view of their health. Another attempt employs a flush annealing technique, using beams with high energy densities in order to rapidly anneal the ion implanted substrate. However, when a wafer with a large diameter is employed to enhance productivity, flush annealing encounters a problem in the uniformity of the heat treatment.

Therefore it is an object of the invention to provide an improved annealing method which activates the implanted impurity atoms without reduction in resistivity of the isolation region in the substrate.

It is also an object of the invention to provide an improved annealing method which is free from the drawbacks inherent in the conventional methods.

SUMMARY OF THE INVENTION

A method of anealing according to the present invention is characterized, inter alia, in that an ion implanted substrate of a group III-V coumpound semiconductor is placed in an inert ambient with a temperature ranging between 500 to 1000 degrees centigrade and a pressure ranging from 30 to 90 atmospheres. When a plurality of ion implanted substrates are simultaneously subjected to the annealing process, two ion implanted substrates may be paired and arranged in such a manner that the ion implanted surface portions are held in face-to-face contact with each other. Then, the paired substrates are placed in the high pressure inert ambient. The inert ambient may be formed of helium, neon, argon, krypton, xenon or nitrogen. However, argon or nitrogen is usually used. The temperature range is determined in consideration of the influences on the annealing effects and the volatilization speed. If the ion implanted substrate is placed in the inert ambient with a temperature below 500 degrees centigrade, sufficient annealing effects can not be expected. On the other hand, if the temperature is increased to over 1000 degrees centigrade, the volatilization is enhanced despite the high pressure inert gas. With regard to the duration of the heat treatment, annealing may at least continue for ten minutes after reaching the highest temperature in order to obtain the activated impurity atoms. However, it may seldom reach to 20 hours in view of the diffusion profile. The substrate may be selected from the group of gallium arsenide compound, gallium phosphide compound, gallium antimonide compound and indium arsenide compound.

BRIEF DESCRIPTION OF THE DRAWINGS

The features and advantages of a method of annealing according to the present invention will be more clearly appreciated from the following description taken in conjunction with the accompanying drawings in which.

DETAILED DESCRIPTION OF THE INVENTION

Figure 1:
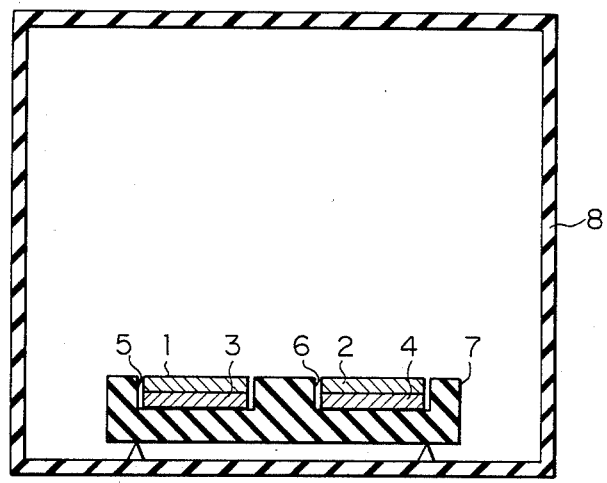
FIG. 1 is a schematic view showing paired substrates in a furnace according to the preferred embodiment of the present invention.

Referring now to FIG. 1 of the drawings a plurality of substrates are shown and indicated at 1, 2, 3 and 4, respectively. Ionized impurity atoms, typically silicon atoms, are implanted into the surface portions of each substrate 1, 2, 3 or 4 for forming active regions therein. The active regions form parts of electric elements such as, for example, high electron mobility transistors, and are separated from each another by insulating regions for electrical isolation. Each substrate 1, 2, 3 or 4 is formed from a group III-V semiconductor rod which is prepared through crystal growth from the liquid phase, and the substrate 1, 2, 3 or 4 has sufficiently high resistivity which is due to the deep energy level EL 2 in the substrate. The EL 2 is considered to be generated by arsenic atoms incorporated in gallium sites. (See Journal of Applied Physics Letters, vol 40 no. 4, pp 342 to 344.) The ion implanted substrates 1 and 2 are respectively paired with the substrates 3 and 4 in such a manner that the ion implanted surface portions are held in face-to-face contact with each other. The paired substrates 1 to 4 are accomodated in recesses 5, 6 formed in a table 7 which is movable into or out of a furnace 8 so that the substrates 1 to 4 are placed in the furnace 8 after ion implantation. Both the table 7 and the furnace 8 are formed of pyrolytic boron nitride (PBN), however, quartz is acceptable if desired.

Figure 2:
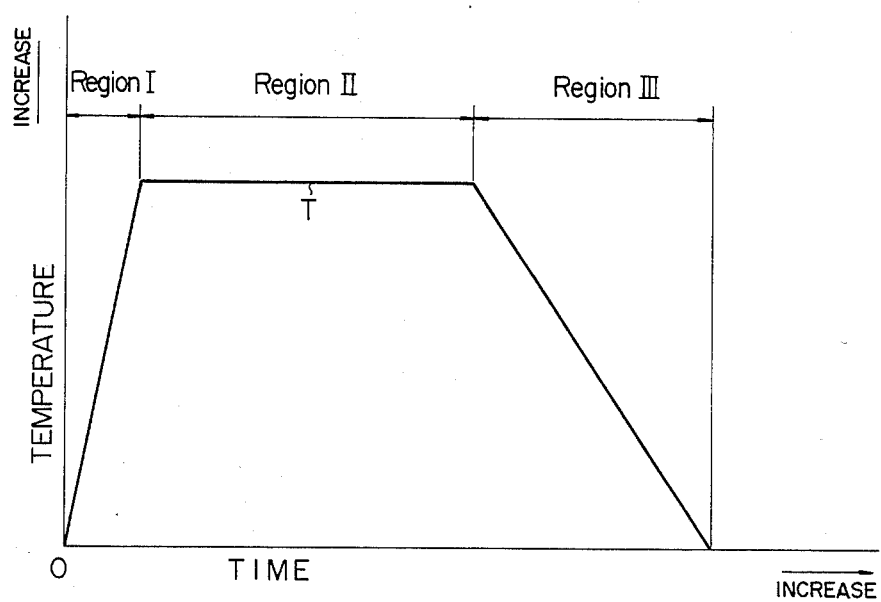
FIG. 2 is a chart showing an annealing cycle according to the preferred embodiment of the present invention.

After accomodation in the furnace 8, there is introduced a compressed argon gas from a nozzle so as to form a high pressure inert ambient though not shown in the drawings. In this instance, the inert ambient is formed of argon gas, however, helium, neon, krypton, xenon or nitrogen, and mixtures thereof are acceptable. When the inert ambient is formed in the furnace 8, the temperature of the inert ambient is increased for annealing in accordance with plots T in FIG. 2. The annealing cycle is divided into three regions I, II and III. Region I is characterized by rapid ascent. When the inert ambient reaches a temperature between 500 and 1000 degrees centigrade, the ambient enters region II where the temperature is maintained in a stable condition for a certain period of time. The time period ranges between ten minutes and ten hours. If the time period is shorter than ten minutes, the activation of the introduced impurity atoms may be insufficient. On the other hand, if region II continues more than ten hours, undesired diffusion of the impurity atoms and the reduction of the resistivity of the isolation region may be encountered owing to the volatilization of the antisite arsenic atoms. Region II is followed by region III where the substrates 1 to 4 are cooled for further processing.

As to the inert gas pressure, the ambient has a certain pressure between 30 and 90 atmospheres. The high pressure inert gas is conductive to a restriction of the volatilization of the antisite arsenic atoms occupying the gallium sites. If the antisite arsenic atoms are volatilized or out-diffused, the El 2 concentration is lowered, thereby reducing the resistivity of the substrates 1 to 4 as mentioned in IEEE Transactions on Electron Devices, vol. ED-29, No. 7, pp 1045 to 1051, July 1982. However, the high pressure inert ambient restricts the volatilization of the antisite arsenic atoms so that the El 2 concentration is not lowered. Moreover, experiments carried out in accordance with the invention teach us that the EL 2 concentration is rather increased when using high pressure ambient. Namely, silicon atoms are introduced into particular portions of each undoped gallium arsenide wafer (resistivity - $1 \times 10^8$ Ωcm) and, then, a pair of substrates held in face-to-face contact with each other are placed in respective argon ambients indicated in Table I, the indicated ambients being formed in a quartz furnace. Resistivities $R_0$ of the undoped GaAs wafers are measured prior to annealing and are compared with their resistivities R measured after annealing. Resistivity ratios $(R-R_0/R_0)$ are shown in Table I. The resistivity values are obtained from van der Pauw measurements. If the resistivities is greater than $1 \times 10^7$ Ωcm, the region is adequate as to isolation. As will be understood from the resistivities ratios $(R-R_0/R_0)$ in Table I, the substrates indicated by numbers 1 to 13 are not affected by the heat attacks imposed thereon during the annealing cycle. However, the substrates indicated by numbers 14, 15 and 17 have resistivities smaller than $1 \times 10^7$ Ωcm, and resistivity ratios over $-90$, and therefore it is impossible to use them as substrates because of the leakage current.

Though not shown in Table I, the substrate indicated by number 16 had an ion implanted region with a resistivity of about $1 \times 10^6$ Ωcm, and therefore the substrate was not suited to fabrication of semiconductor elements. The ion implanted region should have a resistivity of about 1 to $10^7$ Ωcm.

TABLE I

| No. | Press. kg/cm$^2$ | Temp. °C. | Region II Hr. | Region III Hr. | Ratio % |
|---|---|---|---|---|---|
| 1 | 30 | 850 | 3 | 3 | −62 |
| 2 | 50 | 850 | 3 | 3 | −18 |
| 3 | 70 | 500 | 3 | 3 | −40 |
| 4 | 70 | 700 | 3 | 3 | −18 |
| 5 | 70 | 850 | 1 | 3 | −5 |
| 6 | 70 | 850 | 3 | 1 | −6 |
| 7 | 70 | 850 | 3 | 3 | −2 |
| 8 | 70 | 850 | 3 | 5 | 5 |
| 9 | 70 | 850 | 3 | 10 | 28 |
| 10 | 70 | 850 | 5 | 3 | 4 |
| 11 | 70 | 850 | 10 | 3 | 18 |
| 12 | 70 | 900 | 3 | 3 | 42 |
| 13 | 90 | 850 | 3 | 3 | −8 |
| 14 | 20 | 850 | 3 | 3 | −99.995 |
| 15 | 100 | 850 | 3 | 3 | −95 |
| 16 | 70 | 400 | 3 | 3 | ° |
| 17 | 70 | 1100 | 3 | 3 | −99.998 |

When the inert ambients are formed in a furnace of pyrolytic boron nitride, experimental results show the same tendency as shown in Table I.

Table II shows experimental results carried out in various inert ambients. These results suggest that the selection of the inert gas does not affect the resistivity of the substrate.

TABLE II

| No. | Inert Gas | Region II Hr. | Region III Hr. | Ratio % |
|---|---|---|---|---|
| 1 | He | 3 | 3 | −9 |
| 2 | He | 1 | 3 | −18 |
| 3 | He | 3 | 1 | −24 |
| 4 | Ne | 3 | 3 | −4 |
| 5 | Ne | 1 | 3 | −11 |
| 6 | Ne | 3 | 1 | −18 |
| 7 | Kr | 3 | 3 | −1 |
| 8 | Kr | 1 | 3 | −3 |
| 9 | Kr | 3 | 1 | −48 |
| 10 | Xe | 3 | 3 | 3 |
| 11 | N$_2$ | 3 | 3 | −4 |

TABLE II-continued

| No. | Inert Gas | Region II Hr. | Region III Hr. | Ratio % |
|---|---|---|---|---|
| 12 | N$_2$ | 1 | 3 | −8 |
| 13 | N$_2$ | 3 | 1 | −6 |

In the above mentioned embodiment, silicon atoms are introduced in the substrates 1 to 4. However, the present invention is applicable into substrates to which group VI impurities are introduced. The aforementioned experiments have been carried out with gallium arsenide wafers, however, the same tendency is expected in regard to substrates formed of a gallium phosphide compound, gallium antimonide compound or indium arsenide compound.

As will be understood from the foregoing description, the method according to the present invention is advantageous firstly in that the ion implanted substrate can be annealed without a reduction in the resistivity thereof, thereby maintaining electrical isolation between the adjacent elements fabricated on the substrate.

Secondly, the ion implanted substrate is annealed without a physical cap layer so that the annealed substrated is free from contamination due to the cap layer.

Because of the fact that the annealing is carried out in the inert ambient, the operators can work in a safe environment.

Another advantage is that the ion implanted substrate can be uniformly heated by the high temperature inert gas with a resultant high quality of semiconductors devices.

What is claimed is:

1. A method of forming a compound semiconductor device, comprising the steps of:
    selectively implanting impurity ions into a compound semiconductor substrate to form electrical element regions electrically separated by isolation regions of said compound semiconductor substrate; and
    annealing said ion implanted substrate in an inert ambient at a temperature ranging between 500 and 1000 degrees centigrade and at a pressure ranging between 30 to 90 atmospheres.

2. A method as set forth in claim 1, in which at least two ion implanted substrates are placed in said inert ambient, both of said ion implanted substrates having respective ion implanted surface portions held in face-to-face contact with each other.

3. A method as set forth in claim 1, in which said ion implanted substrate is formed of a group III–V compound semiconductor.

4. A method as set forth in claim 3, in which said inert ambient is formed of an inert gas selected from the group of helium, neon, argon, krypton, xenon, nitrogen and mixtures thereof.

5. A method as set forth in claim 3, in which said inert ambient is formed in a furnace of pyrolytic boron nitride.

6. A method as set forth in claim 3, in which said inert ambient is formed in a furnace of quartz.

7. A method as set forth in claim 3, in which said ion implanted substrate is formed of a compound semiconductor selected from the group of gallium arsenide compound, gallium phosphide compound, gallium antimonide compound and indium arsenide compound.

8. A method of annealing as set forth in claim 7, in which said ion implanted substrate is placed in said inert ambient for a time ranging between 10 minutes and 10 hours.

9. A method of forming a gallium arsenide compound semiconductor device, comprising the steps of:
    selectively implanting impurity ions into a gallium arsenide substrate to form electrical element regions electrically separated by isolation regions of said gallium arsenide substrate; and
    annealing said ion implanted gallium arsenide substrate in an inert ambient at a temperature ranging between 500 and 1000 degrees centigrade and at a pressure ranging between 30 to 90 atmospheres, for a time ranging between 10 minutes and 10 hours.

* * * * *

UNITED STATES PATENT AND TRADEMARK OFFICE
CERTIFICATE OF CORRECTION

PATENT NO. : 4,676,840
DATED : June 30, 1987
INVENTOR(S) : Takao Matsumura

It is certified that error appears in the above-identified patent and that said Letters Patent is hereby corrected as shown below:

Column 1, line 56, after "volatilization" insert --of the

Column 1, line 56, after "one" delete "of the"

Column 4, line 5, after "(resistivity"; delete " - " insert -- = --

Column 4, line 29, after "to" insert --10x--

Column 6, line 5, after "ambient," delete "both of"

Signed and Sealed this

Nineteenth Day of July, 1988

Attest:

DONALD J. QUIGG

*Attesting Officer*         *Commissioner of Patents and Trademarks*